United States Patent
Liu et al.

(10) Patent No.: US 12,550,446 B2
(45) Date of Patent: Feb. 10, 2026

(54) ARRAY SUBSTRATE AND DISPLAY DEVICE

(71) Applicants: Hefei BOE Display Technology Co., Ltd., Anhui (CN); BOE Technology Group Co., Ltd., Beijing (CN)

(72) Inventors: Quanzhou Liu, Beijing (CN); Haijiao Qian, Beijing (CN); Liang Chen, Beijing (CN); Zexu Liu, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 173 days.

(21) Appl. No.: 18/276,646

(22) PCT Filed: Jul. 14, 2022

(86) PCT No.: PCT/CN2022/105801
§ 371 (c)(1),
(2) Date: Aug. 10, 2023

(87) PCT Pub. No.: WO2024/011533
PCT Pub. Date: Jan. 18, 2024

(65) Prior Publication Data
US 2025/0022884 A1    Jan. 16, 2025

(51) Int. Cl.
*H10D 86/60* (2025.01)
*G02F 1/1335* (2006.01)
(Continued)

(52) U.S. Cl.
CPC ....... *H10D 86/60* (2025.01); *G02F 1/133514* (2013.01); *G02F 1/13629* (2021.01); *H10D 86/441* (2025.01)

(58) Field of Classification Search
CPC .. H10D 86/60; H10D 86/441; G02F 1/13629; G02F 1/133514
See application file for complete search history.

(56) References Cited

U.S. PATENT DOCUMENTS

| | | | |
|---|---|---|---|
| 2002/0113934 A1* | 8/2002 | Aoki | G02F 1/13458 349/149 |
| 2008/0074351 A1* | 3/2008 | Kawano | G02F 1/136204 345/55 |

(Continued)

FOREIGN PATENT DOCUMENTS

| | | |
|---|---|---|
| CN | 104882452 A | 9/2015 |
| CN | 104934440 A | 9/2015 |

(Continued)

*Primary Examiner* — Mariceli Santiago
(74) *Attorney, Agent, or Firm* — XSENSUS LLP

(57) ABSTRACT

Provided is an array substrate, including: a substrate; a first insulating layer and a second insulating layer that are successively stacked; a first electrode disposed on a side, proximal to the substrate, of the first insulating layer; a second electrode disposed between the first insulating layer and the second insulating layer; and a lap electrode disposed on a side, distal from the substrate, of the second insulating layer. The array substrate includes a plurality of first vias and a plurality of second vias. The lap electrode is electrically connected to the first electrode and is electrically connected to the second electrode. An orthographic projection of the first electrode on the substrate is overlapped with an orthographic projection of the second electrode on the substrate, and covers a region between at least one of the first vias and at least one of the second vias.

7 Claims, 9 Drawing Sheets

(51) Int. Cl.
*G02F 1/1362* (2006.01)
*H10D 86/40* (2025.01)

(56) References Cited

U.S. PATENT DOCUMENTS

| | | |
|---|---|---|
| 2016/0322346 A1 | 11/2016 | Kim |
| 2016/0358947 A1 | 12/2016 | Cai et al. |
| 2017/0092698 A1 | 3/2017 | Zou |
| 2019/0285929 A1 | 9/2019 | Huang et al. |
| 2020/0142268 A1 | 5/2020 | Shin et al. |
| 2021/0036093 A1 | 2/2021 | Okabe et al. |
| 2021/0143183 A1 | 5/2021 | Zhang et al. |
| 2021/0202529 A1 | 7/2021 | Su et al. |
| 2021/0210521 A1 | 7/2021 | Li et al. |
| 2022/0415971 A1 | 12/2022 | Zhao et al. |

FOREIGN PATENT DOCUMENTS

| | | | | |
|---|---|---|---|---|
| CN | 108346622 A | | 7/2018 | |
| CN | 108648614 A | | 10/2018 | |
| CN | 109270754 A | | 1/2019 | |
| CN | 110190103 A | | 8/2019 | |
| CN | 110707065 A | | 1/2020 | |
| CN | 114096940 A | | 2/2022 | |
| CN | 115411057 A | * 11/2022 | ........... H10D 86/441 |
| WO | 2021/213162 A1 | | 10/2021 | |

* cited by examiner

ARRAY SUBSTRATE AND DISPLAY DEVICE

CROSS-REFERENCE TO RELATED APPLICATION

The present disclosure is a U.S. national stage of international application No. PCT/CN2022/105801, filed on Jul. 14, 2022, the content of which is herein incorporated by reference in its entirety.

TECHNICAL FIELD

The present disclosure relates to the field of display technology, and in particular, relates to an array substrate and a display device.

BACKGROUND OF THE INVENTION

As display devices, liquid crystal displays (LCD) have been widely used in electronic products such as tablet computers, televisions, smartphones, and in-vehicle displays because of their advantages of good picture quality, small size, light weight, low drive voltage, low power consumption, no radiation, and low manufacturing cost.

SUMMARY OF THE INVENTION

Embodiments of the present disclosure provide an array substrate and a display device. The technical solutions are as follows.

According to some embodiments of the present disclosure, an array substrate is provided. The array substrate includes:

a substrate;
a first insulating layer and a second insulating layer that are successively stacked along a direction perpendicular to and away from the substrate;
a first electrode disposed on a side, proximal to the substrate, of the first insulating layer;
a second electrode disposed between the first insulating layer and the second insulating layer; and
a lap electrode disposed on a side, distal from the substrate, of the second insulating layer; wherein
the array substrate includes a plurality of first vias and a plurality of second vias, and the lap electrode is electrically connected to the first electrode through the plurality of first vias and is electrically connected to the second electrode through the plurality of second vias; and
an orthographic projection of the first electrode on the substrate is at least partially overlapped with an orthographic projection of the second electrode on the substrate, and the orthographic projection of the first electrode on the substrate covers a region between at least one of the first vias and at least one of the second vias.

In some embodiments, the plurality of first vias are arranged in at least one row, the plurality of second vias are arranged in at least one row, the at least one row of first vias and the at least one row of second vias are arranged in a plurality of columns, and the orthographic projection of the first electrode on the substrate covers at least a portion of a region between a row of the first vias and a row of the second vias that are adjacent.

In some embodiments, the first electrode and the second electrode are both strip-shaped electrodes, a width of the first electrode is greater than a width of the second electrode, and the orthographic projection of the second electrode on the substrate is within the orthographic projection of the first electrode on the substrate.

In some embodiments, the first electrode includes at least one hollowed-out hole, wherein an orthographic projection of the at least one hollowed-out hole on the substrate is between an orthographic projection of the at least one row of first vias on the substrate and an orthographic projection of the at least one row of second vias on the substrate; and an area of the orthographic projection of the at least one hollowed-out hole on the substrate is less than a total area of an orthographic projection of a row of the first vias on the substrate and is less than a total area of an orthographic projection of a row of the second vias on the substrate.

In some embodiments, the first electrode includes a first electrode strip and a second electrode strip that are arranged in parallel, and at least one first connection arm disposed between the first electrode strip and the second electrode strip; and orthographic projections of the plurality of first vias on the substrate are within an orthographic projection of the first electrode strip on the substrate, and orthographic projections of at least a portion of the plurality of second vias on the substrate are within an orthographic projection of the second electrode strip on the substrate and are within the orthographic projection of the second electrode on the substrate.

In some embodiments, an orthographic projection of the first connection arm on the substrate covers an entire region between a first target via and a second target via; wherein the first target via is any of the plurality of first vias, and the second target via is one of the plurality of second vias, of which an orthographic projection is overlapped with the second electrode strip and which is adjacent to the first target via.

In some embodiments, the plurality of second vias include at least one first lap via and a plurality of second lap vias, and the second electrode includes a second electrode body and at least one second connection arm in one-to-one correspondence with the at least one first lap via, wherein the second connection arm is electrically connected to the second electrode body;

wherein an orthographic projection of the at least one first lap via on the substrate is within the orthographic projection of the first electrode strip on the substrate and is within an orthographic projection of a corresponding second connection arm on the substrate; and
orthographic projections of the plurality of second lap vias on the substrate are within the orthographic projection of the second electrode strip on the substrate and are within an orthographic projection of the second electrode body on the substrate.

In some embodiments, the plurality of first vias are arranged in at least one row, and one of the first lap vias is disposed between adjacent two first vias in a row of the first vias; and the plurality of second lap vias are arranged in at least one row.

In some embodiments, in a case a plurality of the first connection arms and a plurality of the second connection arms are provided, the plurality of the first connection arms and the plurality of the second connection arms are alternately arranged one by one, and a gap is present between one of the first connection arms and one of the second connection arm that are adjacent.

In some embodiments, a boundary of an orthographic projection of the first connection arm on the substrate is overlapped with a boundary of an orthographic projection of the second connection arm on the substrate.

In some embodiments, the plurality of first vias are arranged in a plurality of rows and columns, and the plurality of second vias are arranged in a plurality of rows and columns, wherein the plurality of rows of the first vias are in one-to-one correspondence with the plurality of rows of the second vias, and a row of the first vias and a corresponding row of the second vias are arranged in a row; and the orthographic projection of the first electrode on the substrate covers at least a portion of a region, between a column of the first electrodes and a column of the second electrodes that are adjacent.

In some embodiments, the first electrode includes at least one first strip-shaped hole, wherein an orthographic projection of the first strip-shaped hole on the substrate is between orthographic projections of adjacent two rows of the first vias on the substrate and between orthographic projections of adjacent two rows of the second vias on the substrate.

In some embodiments, the orthographic projection of the second electrode on the substrate is within the orthographic projection of the first electrode on the substrate; and the second electrode includes at least one second strip-shaped hole, wherein the at least one second strip-shaped hole is in one-to-one correspondence with the at least one first strip-shaped hole, and a portion of a boundary of an orthographic projection of the second strip-shaped hole on the substrate is overlapped with a portion of a boundary of an orthographic projection of a corresponding first strip-shaped hole on the substrate.

In some embodiments, the plurality of first vias are arranged in at least two rows, and the plurality of second vias include at least one row of first lap vias; wherein a row of the first lap vias are arranged between adjacent two rows of the first vias; and the orthographic projection of the first electrode on the substrate covers an entire region between a row of the first lap vias and adjacent two rows of the first vias.

In some embodiments, the plurality of second vias further include a plurality of second lap vias, wherein one of the second lap vias is disposed between adjacent two first vias in a row of the first vias; and
  the second electrode includes a strip-shaped second electrode body and a plurality of electrode blocks in one-to-one correspondence with the plurality of second lap vias, wherein the second electrode body is electrically connected to the electrode block, an orthographic projection of the second electrode body on the substrate is within an orthographic projection of the at least one row of first lap vias on the substrate, and an orthographic projection of the electrode block on the substrate is within an orthographic projection of a corresponding second lap via on the substrate.

In some embodiments, a portion of the plurality of second lap vias and a row of adjacent two rows of the first vias are arranged in a row; and another portion of the plurality of second vias and another row of the adjacent two rows of the first vias are arranged in a row.

In some embodiments, the substrate includes a display region and a non-display region disposed on a periphery of the display region; and
  the array substrate further includes a plurality of gate lines within the display region and a gate driver on array (GOA) circuit within the non-display region, wherein the GOA circuit includes a plurality of GOA units corresponding to the plurality of gate lines, and signal output terminals in one-to-one correspondence with the plurality of GOA units;
  wherein the GOA unit includes the first electrode and the second electrode, wherein the first electrode in the GOA unit is electrically connected to a corresponding gate line, and the second electrode in the GOA unit is electrically connected to a corresponding signal output terminal.

According to some embodiments of the present disclosure, an array substrate is provided. The array substrate includes:
  a substrate;
  a first insulating layer and a second insulating layer that are successively stacked along a direction perpendicular to and away from the substrate;
  a first electrode disposed on a side, proximal to the substrate, of the first insulating layer;
  a second electrode disposed between the first insulating layer and the second insulating layer; and
  a lap electrode disposed on a side, distal from the substrate, of the second insulating layer;
  wherein the array substrate includes a plurality of first vias and a plurality of second vias, and the lap electrode is electrically connected to the first electrode through the plurality of first vias and is electrically connected to the second electrode through the plurality of second vias; and
  an orthographic projection of the first electrode on the substrate is not overlapped with an orthographic projection of the second electrode on the substrate.

In some embodiments, the first electrode includes a plurality of first connection arms and a first electrode body configured to connect the plurality of first connection arms, wherein orthographic projections of the plurality of first vias on the substrate are within orthographic projections of the plurality of first connections arms on the substrate; and
  the second electrode includes a plurality of second connection arms and a second electrode body configured to connect the plurality of second connection arms, wherein orthographic projections of the plurality of second vias on the substrate are within orthographic projections of the plurality of second connection arms on the substrate;
  wherein the plurality of first connection arms and the plurality of second connection arms are alternately arranged one by one.

In some embodiments, the first electrode and the second electrode are both strip-shaped, an extension direction of the first electrode is parallel to an extension direction of the second electrode, and a gap is present between the orthographic projection of the first electrode on the substrate and the orthographic projection of the second electrode on the substrate.

According to some embodiments of the present disclosure, a display device is provided. The display device includes an array substrate and a color film substrate that are disposed opposite to each other, and a liquid crystal layer disposed between the array substrate and the color film substrate; wherein the array substrate is the array substrate as described above.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

The present disclosure is described in further detail with reference to the accompanying drawings, to clearly present the objects, technical solutions, and advantages of the present disclosure.

In practice, an array substrate of the display device includes a display region and a non-display region disposed on a periphery of the display region. The display region includes a plurality of sub-pixels arranged in arrays and a plurality of gate lines, wherein one of the gate lines is electrically connected to a row of the sub-pixels. The non-display region includes a gate driver on array (GOA) circuit. The GOA circuit is electrically connected to the plurality of gate lines and is configured to supply gate drive signals to the plurality of gate lines.

However, in electrical connection to the plurality of gate lines, the GOA circuit in the array substrate is prone to open circuit. As a consequence, a display effect of the display device is poor.

Figure 1:
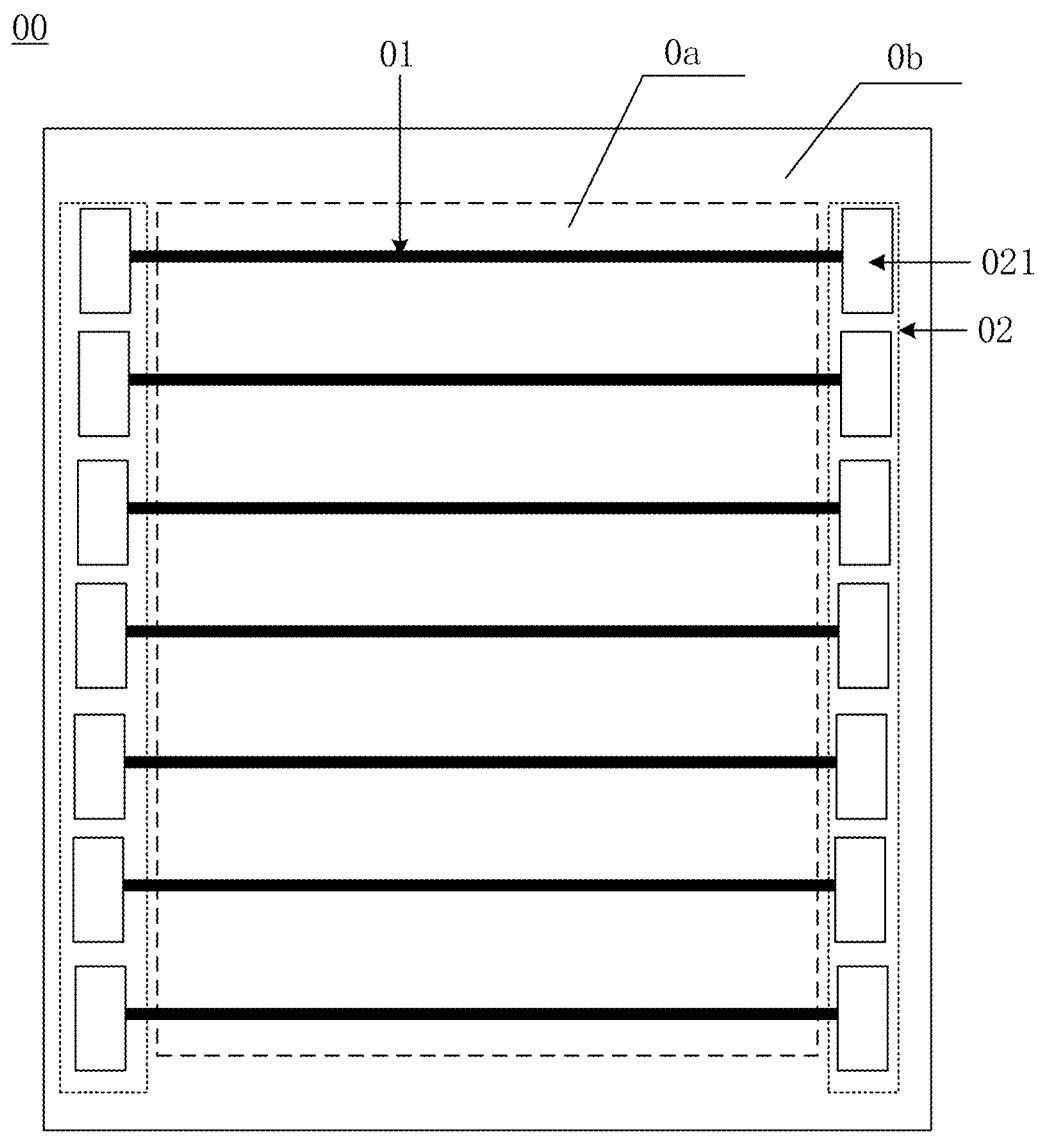
FIG. 1 is a top view of a currently common array substrate.

FIG. 1 is a top view of a currently common array substrate. Referring to FIG. 1, the array substrate 00 includes: a display region 0a and a non-display region 0b disposed on a periphery of the display region 0a. The display region 0a is provided with a plurality of gate lines 01 arranged in parallel, and the non-display region 0b is provided with a GOA circuit 02.

The GOA circuit 02 is electrically connected to the plurality of gate lines 01. For example, the GOA circuit 02 includes a plurality of GOA units 021 corresponding to the plurality of gate lines 01, and the GOA unit 021 is electrically connected to the corresponding gate line 01.

Figure 2:
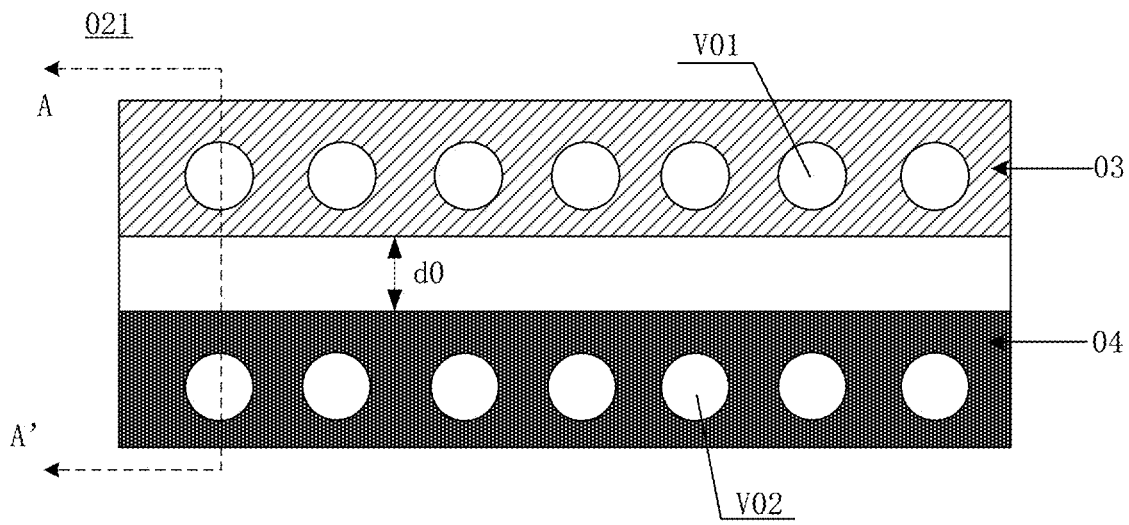
FIG. 2 is a top view of a single GOA unit in the array substrate illustrated in FIG. 1.
Figure 3:
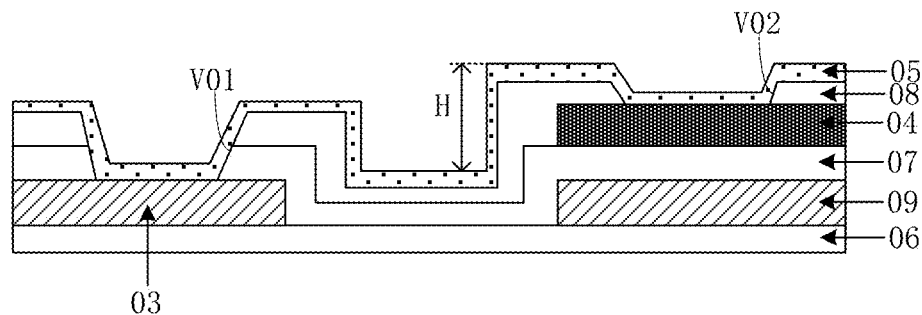
FIG. 3 is a sectional diagram of the GOA unit illustrated in FIG. 2 along an A-A' line.

FIG. 2 is a top view of a single GOA unit in the array substrate illustrated in FIG. 1, and FIG. 3 is a sectional diagram of the GOA unit illustrated in FIG. 2 along an A-A' line. For a clearer view of a structure of the GOA unit 021, referring to FIG. 2 and FIG. 3, the GOA unit 021 includes: a first electrode 03, a second electrode 04, and a lap electrode 05. The first electrode 03 in the GOA unit 021 is electrically connected to the gate line 01 within the display region 0a, and the second electrode 04 in the GOA unit 021 is electrically connected to a signal output terminal in the GOA circuit 021. The first electrode 03 and the second electrode 04 herein are lapped to each other by the lap electrode 05. In this way, the signal output terminal in the GOA circuit 021 transmits a gate drive signal to the gate line 01 over the second electrode 04, the lap electrode 05, and the first electrode 03 in sequence, such that the gate line 01 is capable of receiving the gate drive signal output by the signal output terminal.

For example, the GOA unit 021 is arranged on a substrate 06 in the array substrate 00, and the array substrate 00 further includes: a first insulating layer 07 and a second insulating layer 08. The first electrode 03 is disposed on the substrate 06, and the first insulating layer 07 is disposed on a side, distal from the substrate 06, of the first electrode 03. The second electrode 04 is disposed on a side, distal from the substrate 06, of the first insulating layer 07, and the second insulating layer 08 is disposed on a side, distal from the substrate 06, of the second electrode 04. The lap electrode 05 is disposed on a side, distal from the substrate 06, of the second insulating layer 08. The array substrate 00 includes a first via V01 running through the first insulating layer 07 and the second insulating layer 08, and a second via V02 running through the second insulating layer 08. An orthographic projection of the first via V01 on the substrate 06 is within an orthographic projection of the first electrode 03 on the substrate, such that the lap electrode 05 is lapped to the first electrode 03 through the first via V01. An orthographic projection of the second via V02 on the substrate 06 is within an orthographic projection of the second electrode 04 on the substrate 06, such that the lap electrode 05 is further lapped to the second electrode 04 through the second via V02. In this way, the first electrode 03 and the second electrode 04 are ensured to be electrically connected to each other by the lap electrode 05.

However, the array substrate 00 typically further includes a third electrode 09. The third electrode 09 and the first electrode 03 are disposed in the same layer and made of the same material. The orthographic projection of the second electrode 04 on the substrate 06 is within an orthographic projection of the third electrode 09 on the substrate 06, and a gap do is present between the third electrode 09 and the first electrode 03 on the substrate 06. In this way, only the first insulating layer 07 and the second insulating layer 08 are present in the gap do between the first electrode 03 and the third electrode 09, and at the same time, the third electrode 09, the first insulating layer 07, the second electrode 06, and the second insulating layer 08 are stacked in a region around the second via V02.

In this way, a height difference H between a portion, within the gap do, of the lap electrode 05 and a portion, around the second via V02, of the lap electrode 05 is large, and this height difference H is the sum of a thickness of the third electrode 09 and a thickness of the second electrode 04. As a consequence, the lap electrode 05 requires a steeper climb prior to being lapped to the second electrode 05. That is, a climbing height of the lap electrode 05 is large. In this case, the lap electrode 05 is prone to open circuit, resulting in a poor electrical connection effect between the first electrode 03 and the second electrode 04, which leads to a poor electrical connection effect between the GOA circuit 02 and the plurality of gate lines 01, and thus a display effect of the display device with such array substrate 00 integrated is seriously affected.

Figure 4:
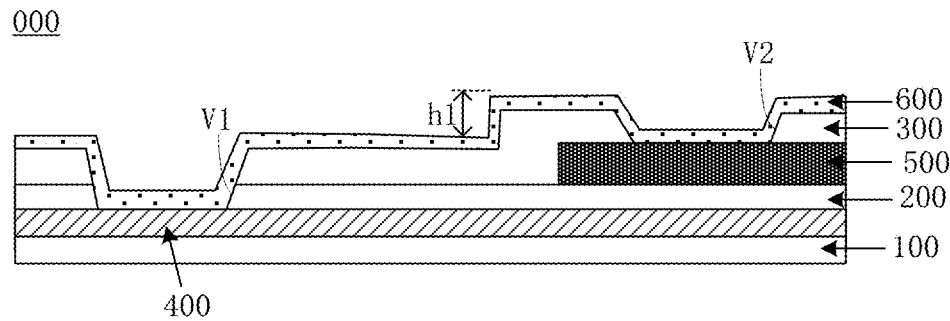
FIG. 4 is a schematic structural diagram of film layers of an array substrate according to some embodiments of the present disclosure.

FIG. 4 is a schematic structural diagram of film layers of an array substrate according to some embodiments of the present disclosure. Referring to FIG. 4, the array substrate 000 includes: a substrate 100, a first insulating layer 200, a second insulating layer 300, a first electrode 400, a second electrode 500, and a lap electrode 600.

The first insulating layer 200 and the second insulating layer 300 in the array substrate 000 are successively stacked along in a direction perpendicular to and away from the substrate 100.

The first electrode 400 in the array substrate 000 is disposed on a side, proximal to the substrate 100, of the first insulating layer 200. The second electrode 500 is disposed between the first insulating layer 200 and the second insulating layer 300. The lap electrode 600 is disposed on a side, distal from the substrate 100, of the second insulating layer 300.

The array substrate 000 includes a plurality of first vias V1 and a plurality of second vias V2. The lap electrode 600 is lapped to the first electrode 400 through the plurality of first vias V1, and the lap electrode 600 is further lapped to the second electrode 500 through the plurality of second vias V2. In this way, the second electrode 500 is lapped to the first electrode 400 by the lap electrode 600.

Exemplarily, the first via V1 in the array substrate 000 is a via running through both the second insulating layer 300 and the first insulating layer 200 simultaneously, and the second via V2 in the array substrate 000 is a via only running through the second insulating layer 300. Orthographic projections of the plurality of first vias V1 on the substrate 100 are within an orthographic projection of the first electrode 400 on the substrate 100, and the orthographic projection of the first electrode 400 on the substrate 100 is within an orthographic projection of the lap electrode 600 on the substrate 100, such that the lap electrode 600 is ensured to be lapped to the first electrode 400 through the plurality of first vias V1. Similarly, orthographic projections of the plurality of second vias V2 on the substrate 100 are within an orthographic projection of the second electrode 500 on the substrate 100, and the orthographic projection of the second electrode 500 on the substrate 100 is within the orthographic projection of the lap electrode 600 on the substrate 100, such that the lap electrode 600 is ensured to be lapped to the second electrode 500 through the plurality of second vias V2.

In the present disclosure, the orthographic projection of the first electrode 400 on the substrate 100 is at least partially overlapped with the orthographic projection of the second electrode 500 on the substrate 100, and the orthographic projection of the first electrode 400 on the substrate 100 covers a region between at least one of the first vias V1 and at least one of the second vias V2.

In some embodiments, in the case that the orthographic projection of the first electrode 400 on the substrate 100 covers the region between at least one of the first vias V1 and at least one of the second vias V2, the first electrode 400, the first insulating layer 200, and the second insulating layer 300 are stacked in a region between the first via V1 and the second via V2, and the first electrode 400, the first insulating layer 200, the second electrode 500, and the second insulating layer 300 are stacked in a region around the second via V2 at the same time. In this way, a height difference $h_1$ between a portion, between the first via V1 and the second via V2, of the lap electrode 600 and a portion, around the second via V2, of the lap electrode 600 is small, and this height difference $h_1$ is a thickness of the second electrode 500. Therefore, during the process that the lap electrode 600 is lapped to the second electrode 500, a climbing height of the lap electrode 600 is small, which effectively reduces the probability of open circuit occurring to the lap electrode 600, such that an electrical connection effect between the first electrode 400 and the second electrode 500 is better.

Figure 5:
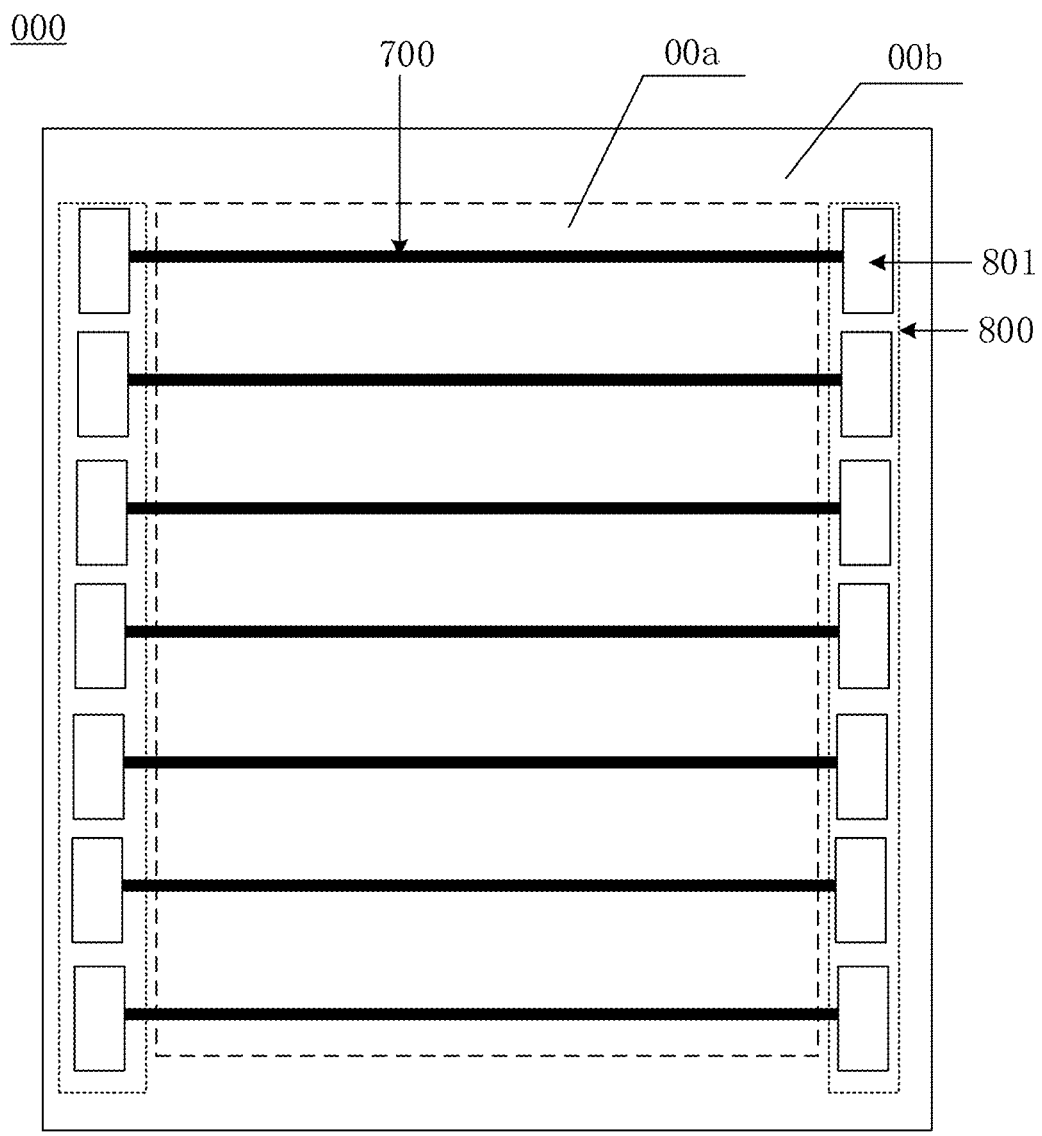
FIG. 5 is a top view of an array substrate according to some embodiments of the present disclosure.

FIG. 5 is a top view of an array substrate according to some embodiments of the present disclosure. In some embodiments, as illustrated in FIG. 5, the array substrate 000 includes a display region 00a and a non-display region 00b disposed on a periphery of the display region 00a. The array substrate 000 further includes: a plurality of gate lines 700 within the display region 00a, and a GOA circuit 800 within the non-display region 00b. The GOA circuit 800 includes a plurality of GOA units 801 corresponding to the plurality of gate lines 700, and a plurality of signal output terminals (not illustrated in FIG. 5) in one-to-one correspondence with the plurality of GOA units 801.

The GOA unit 801 includes: a first electrode 400 and a second electrode 500. The first electrode 400 in the GOA unit 801 is electrically connected to the corresponding gate line 700, and the second electrode 500 in the GOA unit 801 is electrically connected to the corresponding signal output terminal. The GOA unit 801 herein typically includes the lap electrode 600, and the signal output terminal transmits a gate drive signal to the gate line 700 successively over the lap electrode 600, the second electrode 500, and the first electrode 400. In the present disclosure, in the case that the electrical connection effect between the first electrode 400 and the second electrode 500 is better, an electrical connection effect between the GOA unit 801 and the gate line 700 is ensured to be better, such that an electrical connection effect between the GOA circuit 800 and the plurality of gate lines 700 are ensured to be better.

In summary, some embodiments of the present disclosure provide an array substrate, including: the substrate, the first insulating layer, the second insulating layer, the first electrode, the second electrode, and the lap electrode. In the case that the orthographic projection of the first electrode on the substrate covers the region between at least one of the first vias and at least one of the second vias, the first electrode, the first insulating layer, and the second insulating layer are stacked in the region between the first via and the second via, and the first electrode, the first insulating layer, the second electrode, and the second insulating layer are stacked in the region around the second via at the same time. In this way, the height difference between the portion, between the first via and the second via, of the lap electrode and the portion, around the second via, of the lap electrode is small, and this height difference is the thickness of the second electrode. Therefore, during the process that the lap electrode is lapped to the second electrode, the climbing height of the lap electrode is small, which effectively reduces the probability of open circuit occurring to the lap electrode. In this way, the electrical connection effect between the first electrode and the second electrode is better, such that the electrical connection effect between the GOA circuit and the plurality of gate lines in the array substrate is better, and thus the display effect of the display device with the array substrate integrated is effectively improved.

In some embodiments, the GOA unit 801 in the GOA circuit 800 in the array substrate 000 has a variety of structures, descriptions of which are given by some embodiments of the present disclosure using the following four optional implementations as an example.

Figure 6:
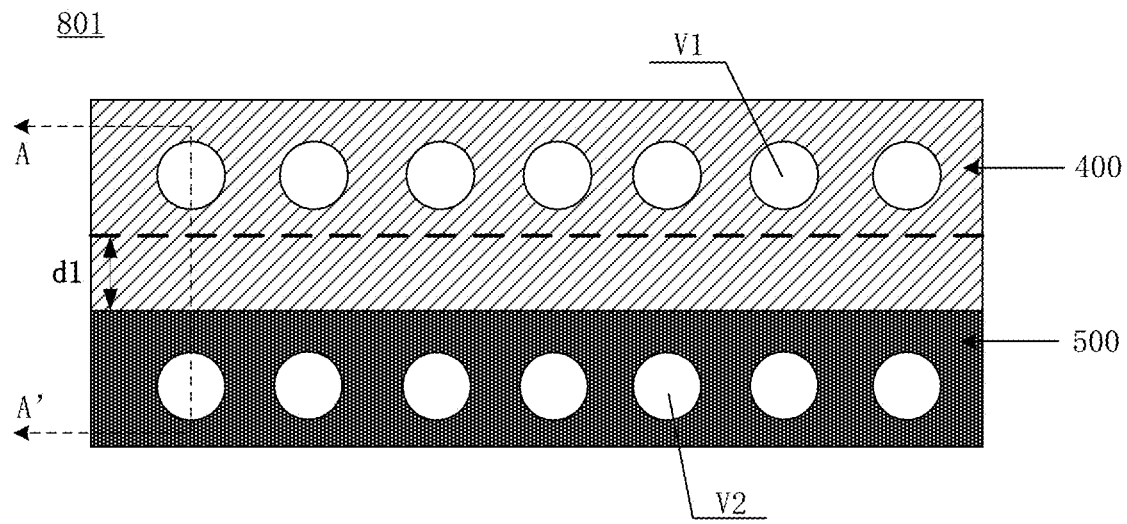
FIG. 6 a top view of a single GOA unit in an array substrate according to some embodiments of the present disclosure.

FIG. 6 a top view of a single GOA unit in an array substrate according to some embodiments of the present disclosure. In a first optional implementation, referring to FIG. 6, the plurality of first vias V1 in the array substrate 000 are arranged in at least one row, and the plurality of second vias V2 in the array substrate 000 are arranged in at least one row. The at least one row of first vias V1 and the at least one row of second vias V2 are arranged in a plurality of columns. The orthographic projection of the first electrode 400 on the substrate covers at least a portion of a region between a row of first vias V1 and a row of second vias V2 that are adjacent. It should be noted that a film-layer schematic diagram of a cross section of FIG. 6 at a position A-A' may be referred to FIG. 4.

In some embodiments, the plurality of first vias V1 are arranged in a row and the plurality of second vias V2 are also arranged in a row. In the case that the orthographic projection of the first electrode 400 on the substrate 100 covers at least a portion of a region between a row of first vias V1 and a row of second vias V2 that are adjacent, the first electrode 400, the first insulating layer 200, and the second insulating layer 300 are stacked in at least a portion of the region between the row of first vias V1 and the row of second vias V2, and the first electrode 400, the first insulating layer 200, the second electrode 500, and the second insulating layer 300 are stacked in the region around the second via V2. In this way, the height difference h1 between at least the portion, between the first via V1 and the second via V2, of the lap electrode 600 and the portion, around the second via V2, of the lap electrode 600 is small, such that the probability of open circuit occurring to the lap electrode 600 is effectively reduced In some embodiments, the first electrode 400 and the second electrode 500 are both strip-shaped electrodes. A width of the first electrode 400 is larger than a width of the second electrode 500, and the orthographic projection of the second electrode 500 on the substrate 100 is within the orthographic projection of the first electrode 400 on the substrate 100.

In the present disclosure, in the case that the orthographic projection of the second electrode 500 on the substrate 100 is within the orthographic projection of the first electrode 400 on the substrate 100, the orthographic projection of the first electrode 400 on the substrate 100 is ensured to cover an entire area d1 between a row of first vias V1 and a row of second vias V2 that are adjacent. In this way, the height difference h1 between the portion, between the first via V1 and the second via V2, of the lap electrode 600 and the portion, around the second via V2, of the lap electrode 600 is small, such that the probability of open circuit occurring to the lap electrode 600 is further reduced.

Figure 7:
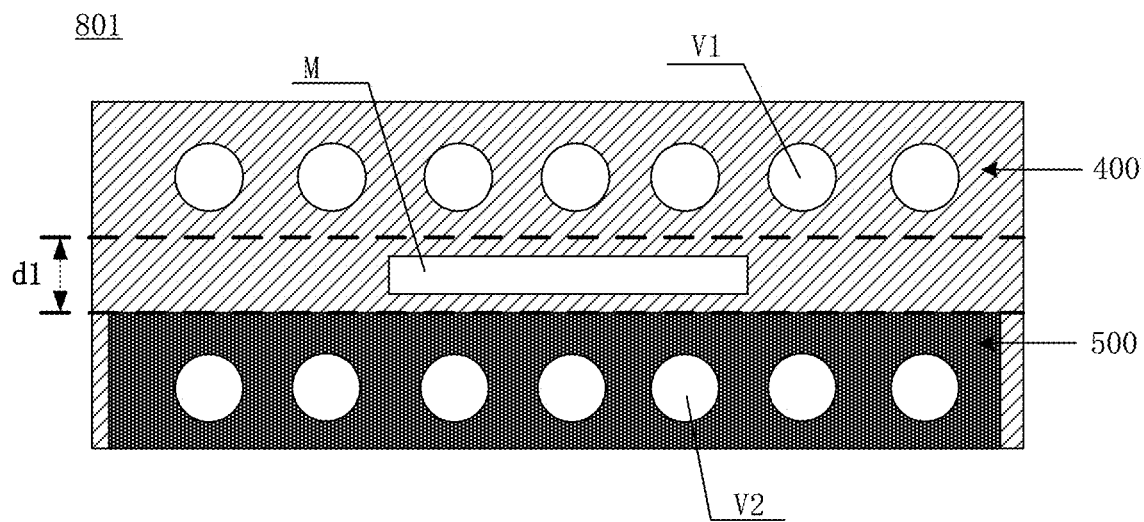
FIG. 7 a top view of a single GOA unit in another array substrate according to some embodiments of the present disclosure.

FIG. 7 a top view of a single GOA unit in another array substrate according to some embodiments of the present disclosure. Optionally, referring to FIG. 7, in the case that the orthographic projection of the first electrode 400 on the substrate 100 covers a portion of a region between a row of first electrodes 400 and a row of second electrodes 500 that are adjacent, the first electrode 400 includes at least one hollowed-out hole M. An orthographic projection of the at least one hollowed-out hole M on the substrate 100 is between an orthographic projection of at least one row of first vias V1 on the substrate 100 and an orthographic projection of at least one row of second vias V2 on the substrate 100. An area of the orthographic projection of the at least one hollowed-out hole M on the substrate 100 is smaller than a total area of an orthographic projection of a row of first vias V1 on the substrate 100 and is smaller than a total area of an orthographic projection of a row of second vias V2 on the substrate 100. Exemplarily, the first electrode 400 has one hollowed-out hole M.

In the case that the area of the orthographic projection of one hollowed-out hole M on the substrate 100 is smaller than both the total area of the orthographic projection of a row of first vias V1 on the substrate 100 and the total area of the orthographic projection of a row of second vias V2 on the substrate 100, the orthographic projection of the first electrode 400 on the substrate 100 is ensured to cover a portion of the region between a row of first electrodes 400 and a row of second electrodes 500 that are adjacent, which reduces the probability of open circuit occurring to the lap electrode 600. Moreover, the first electrode 400 is generally made of a metallic conductor material, and in the case that at least one hollowed-out hole M is arranged in the first electrode 400, the area of the orthographic projection of the first electrode 400 on the substrate 100 is reduced, such that the probability of undesirable defect of electrostatic breakdown due to accumulation of electric charges at the first electrode 400 during a manufacturing process of the array substrate 000 is reduced, and thus the display effect of the display device with the array substrate integrated is improved.

Figure 8:
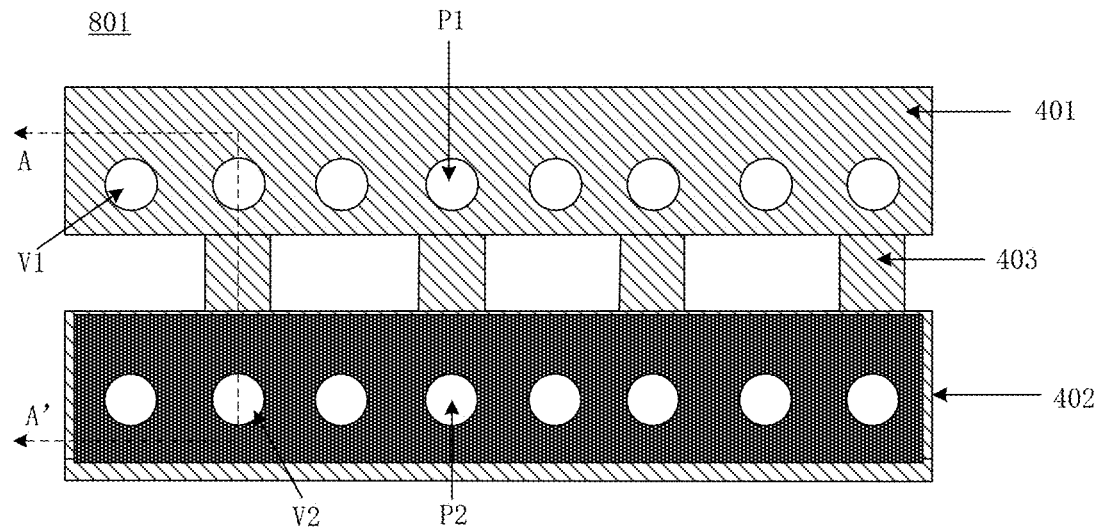
FIG. 8 a top view of a single GOA unit in still another array substrate according to some embodiments of the present disclosure.

FIG. 8 a top view of a single GOA unit in another array substrate according to some embodiments of the present disclosure. In a second optional implementation, referring to FIG. 8, the first electrode 400 includes: a first electrode strip 401 and a second electrode strip 402 that are arranged in parallel, and at least one first connection arm 403 disposed between the first electrode strip 401 and the second electrode strip 402. Exemplarily, a plurality of first connection arms 403 in the first electrode 400 are provided. One end of each of the first connection arms 403 is connected to the first electrode strip 401, and the other end of that is connected to the second electrode strip 402. An extension direction of each of the first connection arms 403 is perpendicular to an extension direction of the first electrode strip 401.

The orthographic projections of the plurality of first vias V1 in the array substrate 000 on the substrate 100 are within the orthographic projection of the first electrode strip 401 on the substrate 100, and the orthographic projections of at least a portion of the plurality of second vias V2 in the array substrate 000 on the substrate 100 are within the orthographic projection of the second electrode strip 402 on the substrate and are within the orthographic projection of the second electrode 500 on the substrate 100. It should be noted that a film-layer schematic diagram of a cross section of FIG. 8 at a position A-A' may be referred to FIG. 4.

In this case, by arranging the first connection arm 403 between the first electrode strip 401 and the second electrode strip 402, the first connection arm 403, the first insulating layer 200, and the second insulating layer 300 are stacked between the plurality of first vias V1 and the plurality of second vias V2, and the first electrode 400, the first insulating layer 200, the second electrode 500, and the second insulating layer 300 are stacked in the region around the second via V2. In this way, the height difference h1 between at least a portion, on the first connection arm 403, of the lap electrode 600 and the portion, around the second via V2, of the lap electrode 600 is small, which effectively reduces the probability of open circuit occurring to the lap electrode 600.

In some embodiments, as illustrated in FIG. 8, an orthographic projection of the first connection arm 403 on the substrate 100 covers an entire region between a first target via P1 and a second target via P2. The first target via P1 herein is any of the plurality of first vias V1, and the second target via P2 is one of the plurality of second vias V2 of which an orthographic projection is overlapped with the second electrode strip 402 and which is adjacent to the first target via P1.

In this case, the portion, on the first connection arm 403, of the lap electrode 600 is ensured to be directly electrically connected to the portion, around the second via V2, of the lap electrode 600, such that the electrical connection effect between the first electrode 300 and the second electrode 400 is further improved.

Figure 9:
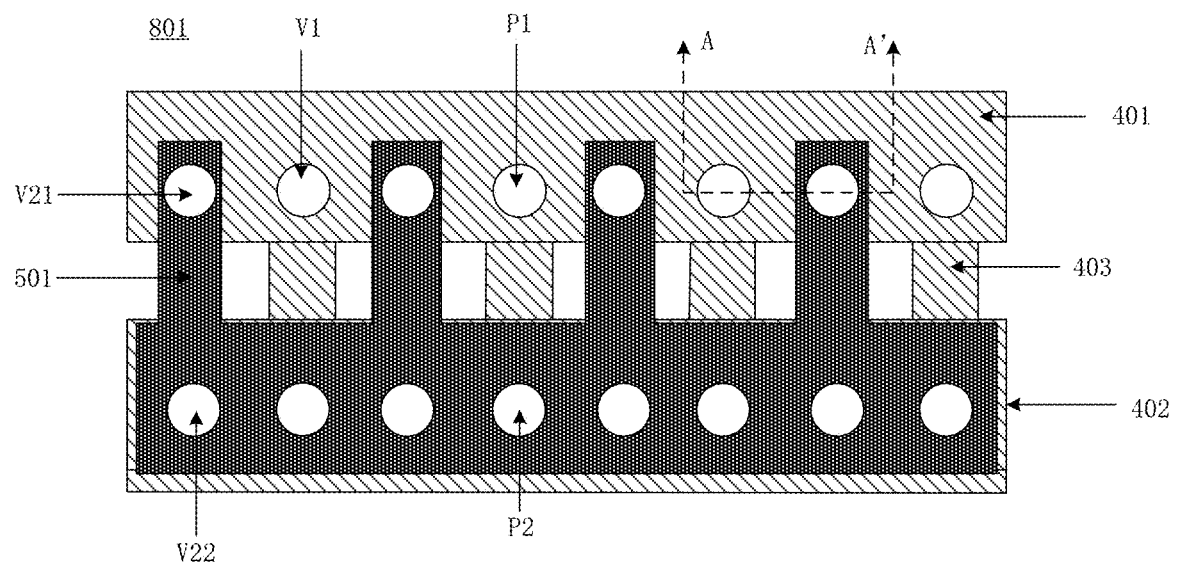
FIG. 9 a top view of a single GOA unit in still another array substrate according to some embodiments of the present disclosure.

FIG. 9 a top view of a single GOA unit in still another array substrate according to some embodiments of the present disclosure. Optionally, referring to FIG. 9, the plurality of second vias V2 include: at least one first lap via V21 and a plurality of second lap vias V22. The second electrode 500 includes: a second electrode body 501 and at least one second connection arm 502 in one-to-one correspondence with the at least one first lap via V21. The second connection arm 502 is electrically connected to the second electrode body 501. The extension direction of the first connection arm 403 is parallel to an extension direction of the second connection arm 502.

An orthographic projection of the at least one first lap via V21 on the substrate 100 is within the orthographic projection of the first electrode strip 401 on the substrate 100 and is within an orthographic projection of the corresponding second connection arm 502 on the substrate. Orthographic projections of the plurality of second lap vias V22 on the substrate 100 are within an orthographic projection of the second electrode strip 500 on the substrate and are within an orthographic projection of the second electrode body 501 on the substrate 100. It should be noted that a film-layer schematic diagram of a cross section of FIG. 9 at a position A-A' may be referred to FIG. 4.

In this case, the first electrode 400, the first insulating layer 200, and the second insulating layer 300 are stacked in the region between the first via V1 and the first lap via V21, and the first electrode 400, the first insulating layer 200, the second electrode 500, and the second insulating layer 300 are stacked in the region around the first lap via V21 at the same time. In this way, the height difference h1 between a portion, between the first via V1 and the first lap via V21, of the lap electrode 600 and a portion, around the first lap via V21, of the lap electrode 600 is small, and this height difference h1 is the thickness of the second electrode 500. Therefore, during the process that the lap electrode 600 is lapped to the second electrode 500, the climbing height of the lap electrode 600 is small.

Figure 10:
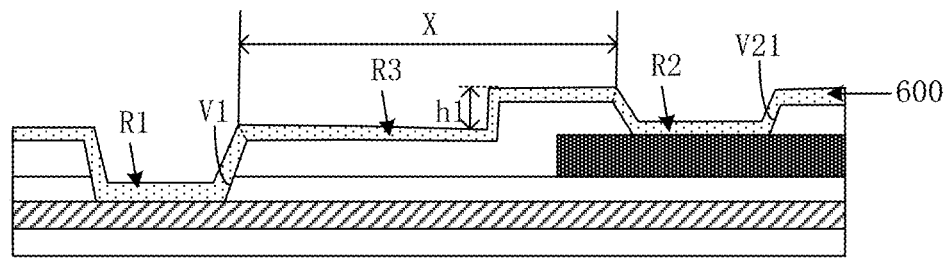
FIG. 10 is a schematic diagram of a lap resistance of a lap electrode 600 in the GOA unit illustrated in FIG. 9.

FIG. 10 is a schematic diagram of a lap resistance of a lap electrode 600 in the GOA unit illustrated in FIG. 9. It should be noted that, referring to FIG. 10, a lap resistance of the first via V1 and the first lap via V21 in the lap electrode 600 in includes: a resistance R1 of a portion, within the first via V1, of the lap electrode 600, a resistance R2 of a portion, within the first lap via V21, of the lap electrode 600, and a resistance R3 of a portion, between the first lap via V21 and the first via V1, of the lap electrode 600. Different GOA units have the first vias V1 and the first lap vias V21 of the same shape and size. In this way, in different GOA units, the resistances R1, within the first vias V1, of the lap electrodes 600 are the same; and the resistances R2, within the first lap vias V21, of the lap electrodes 600 are the same.

In different GOA units, distances between the first lap vias V21 and the first vias V1 are different, and the resistances R3 of the portions, between the first lap vias V21 and the first vias V1, of the lap electrodes 600 are also different. The resistance R3 of the portion, between the first lap via V21 and the first via V1, of the lap electrode 600 includes: a plane resistance Ra and an inclination resistance Rb. That is, R3=Ra+Rb. The plane resistance Ra is proportional to the distance X between the first lap via V21 and the first via V1. That is, Ra=R0*X/W. The inclination resistance Rb is proportional to the climbing height h1. That is, Rb=R0*h1/W. R0 is a unit resistance of the lap electrode 600, and W is a width, along the extension direction the first electrode strip 401, of the lap electrode 600. The unit resistance R0 is only related to a thickness and material of the lap electrode 600.

In the case that the lap electrode 600 is lapped to the first via V1 through the first lap via V21, the distance X between the first lap via V21 and the first via V1 is small, and the climbing height h1 of the lap electrode 600 is also small. Therefore, the resistance R3 of the portion, between the first lap via V21 and the first via V1, of the lap electrode 600 is also small. In this way, the lap resistance of the lap electrode 600 for being lapped to the first via V1 through the first lap via V21 is reduced, and an interference to signals transmitted within the lap electrode 600 is reduced, and thus a lap efficiency of the lap electrode 600 is improved.

In some embodiments, as illustrated in FIG. 9, the plurality of first vias V1 are arranged in at least one row. One of the first lap vias V21 is disposed between adjacent two first vias V1 in a row of first vias V1. The plurality of second lap vias V21 are arranged in at least one row.

In the case that the first lap via V21 is disposed between adjacent two first vias V1 in a row of first vias V1, the uniformity of connecting the first electrode 400 to the second electrode 500 through the first via V1 and the first lap via V21 is improved, and the electrical connection between the first electrode 400 and the second electrode 500 is ensured to be effective.

It should be noted that, referring to FIG. 9, in the case that a plurality of first connection arms 403 and a plurality of second connection arms 502 are provided, the plurality of first connection arms 403 and the plurality of second connection arms 502 are alternately arranged one by one, and gaps are present between first connection arms 403 and second connection arms 502 that are adjacent.

In this case, in one aspect, the height difference h1 between the portion, between the first via V1 and the first lap via V21, of the lap electrode 600 and the portion, around the first lap via V21, of the lap electrode 600 is small; in another aspect, the height difference h1 between the portion, on the first connection arm 403, of the lap electrode 600 and the portion, around the second via V2, of the lap electrode 600 is also small. In this way, during the process that the lap electrode 600 is lapped top the second electrode 500, an area of a region, wherein the climbing height is small, in the lap electrode 600 is increased, such that the probability of open circuit occurring to the lap electrode 600 is further reduced.

In some embodiments, a boundary of the orthographic projection of the first connection arm 403 on the substrate 100 is consistent with a boundary of the orthographic projection of the second connection arm 502 on the substrate 101. In this way, the area of the region, where the climbing height is small, in the lap electrode 600 is the largest, and thus the probability of open circuit occurring to the lap electrode 600 is the smallest.

Figure 11:
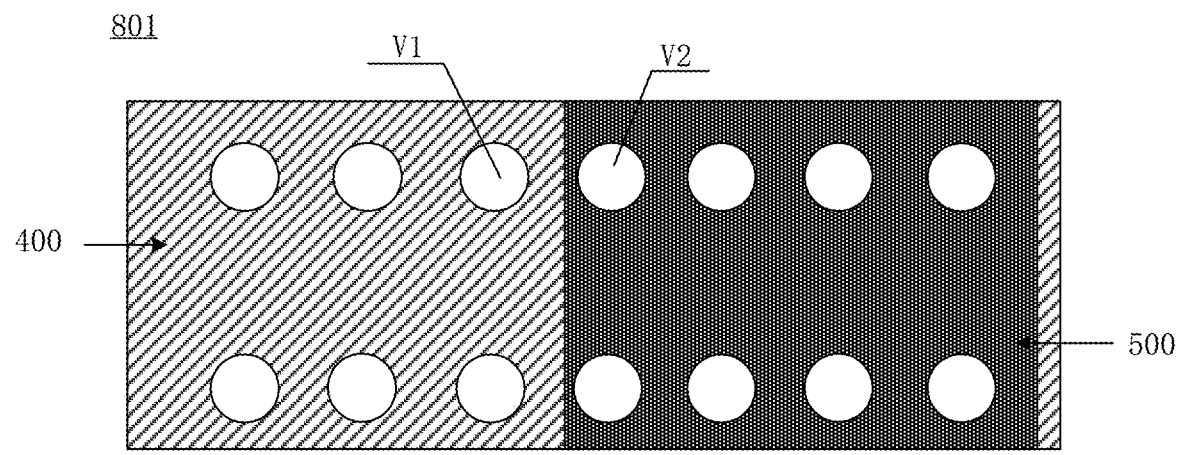
FIG. 11 a top view of a single GOA unit in still another array substrate according to some embodiments of the present disclosure.

FIG. 11 a top view of a single GOA unit in still another array substrate according to some embodiments of the present disclosure. In a third implementation, referring to FIG. 11, the plurality of first vias V1 are arranged in a plurality of rows and columns, the plurality of second vias V2 are arranged in a plurality of rows and columns, and the plurality of rows of first vias V1 are in one-to-one correspondence with the plurality of rows of second vias V2. A row of first vias V1 and a corresponding row of second vias V2 are arranged in a row. The orthographic projection of the first electrode 400 on the substrate covers at least a portion of a region between a column of first electrodes 400 and a column of second electrodes 500 that are adjacent.

In the case that the plurality of rows of first vias V1 are in one-to-one correspondence with the plurality of rows of second vias V2, for the first via V1 and the second via V2 that are adjacent in each row, the first electrode 400, the first insulating layer 200, and second insulating layer 300 are stacked in the region between the first via V1 and the second via V2, and the first electrode 400, the first insulating layer 200, the second electrode 500, and the second insulating layer 300 are stacked in the region around the second via V2. In this way, it is ensured that, in each row of first vias V1 and second via V2, the height difference h1 between the portion, between the first via V1 and the second via V2, of the lap electrode 600 and the portion, around the second via V2, of the lap electrode 600 is small.

Figure 12:
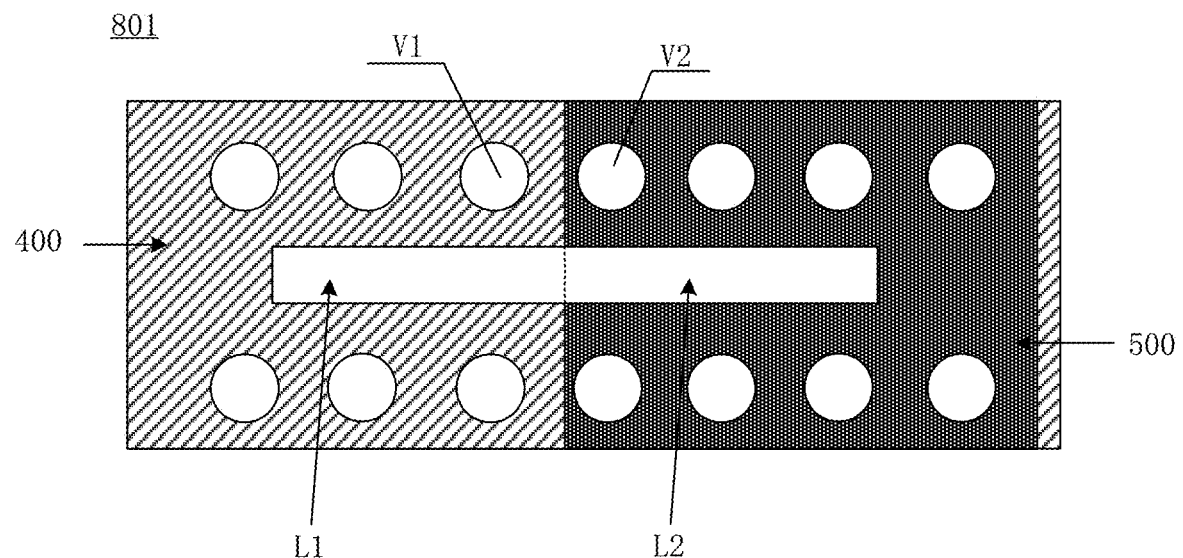
FIG. 12 a top view of a single GOA unit in still another array substrate according to some embodiments of the present disclosure.
Figure 13:
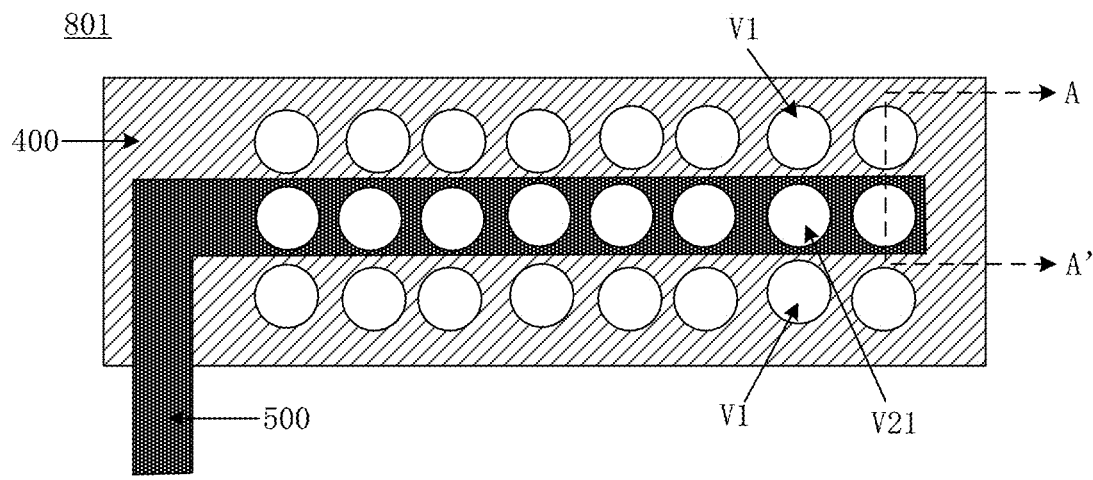
FIG. 13 a top view of a single GOA unit in still another array substrate according to some embodiments of the present disclosure.

FIG. 13 a top view of a single GOA unit in still another array substrate according to some embodiments of the present disclosure. Optionally, referring to FIG. 12, the first electrode 400 includes at least one first strip-shaped hole L1. An orthographic projection of the first strip-shaped hole L1 on the substrate 100 is between orthographic projections of adjacent two rows of first vias V1 on the substrate 100, and is between orthographic projections of adjacent two rows of second vias V2 on the substrate.

In this case, under the prerequisite that the height difference h1 between the portion, between the first via V1 and the second via V2, of the lap electrode 600, and the portion, around the second vias V2, of the lap electrode 600 is ensured to be small, the area of the orthographic projection of the first electrode 400 on the substrate 100 is reduced, such that the probability of the undesirable defect of electrostatic breakdown due to the accumulation of electric charges at the first electrode 400 during the manufacturing process of the array substrate 000 is reduced.

In some embodiments, as illustrated in FIG. 12, the orthographic projection of the second electrode 500 on the substrate is within the orthographic projection of the first electrode 400 on the substrate. The second electrode 500 includes at least one second strip-shaped hole L2. The at least one second strip-shaped hole L2 is in one-to-one correspondence with the at least one first strip-shaped hole L1. A portion of a boundary of an orthographic projection of the second strip-shaped hole L2 on the substrate 100 is overlapped with a portion of a boundary of the orthographic projection of the corresponding first strip-shaped hole L1 on the substrate 100.

In the case that the first electrode 400 includes the first strip-shaped hole L1 and the second electrode 500 includes the second strip-shaped hole L2, the area of the orthographic projection of the first electrode 400 on the substrate 100 is further reduced, such that the probability of the undesirable defect of electrostatic breakdown due to the accumulation of electric charges at the first electrode 400 during the manufacturing process of the array substrate 000 is further reduced.

FIG. 13 a top view of a single GOA unit in still another array substrate according to some embodiments of the present disclosure. In a fourth implementation, referring to FIG. 13, the plurality of first vias V1 are arranged in at least two rows. The plurality of second vias V2 include at least one row of first lap vias V21. A row of first lap vias V21 are arranged between adjacent two rows of first vias V1. The orthographic projection of the first electrode 400 on the substrate 100 covers an entire region between a row of first lap vias V21 and adjacent two rows of first vias V1. It should be noted that a film-layer schematic diagram of a cross section of FIG. 13 at a position A-A' may be referred to FIG. 4.

In this case, a row of first lap vias V21 is lapped to adjacent two rows of first vias V1 by the lap electrode 600, such that the number of first vias V1 lapped to the first lap vias V21 is increased. The height difference h1 between the portion, between the first via V1 and the first lap via V21, of the lap electrode 600 and the portion, around the first lap via V21, of the lap electrode 600 is small, such that the area of the region, where the climbing height is small, in the lap electrode 600 is increased, and thus the probability of open circuit occurring to the lap electrode 600 is further reduced.

Figure 14:
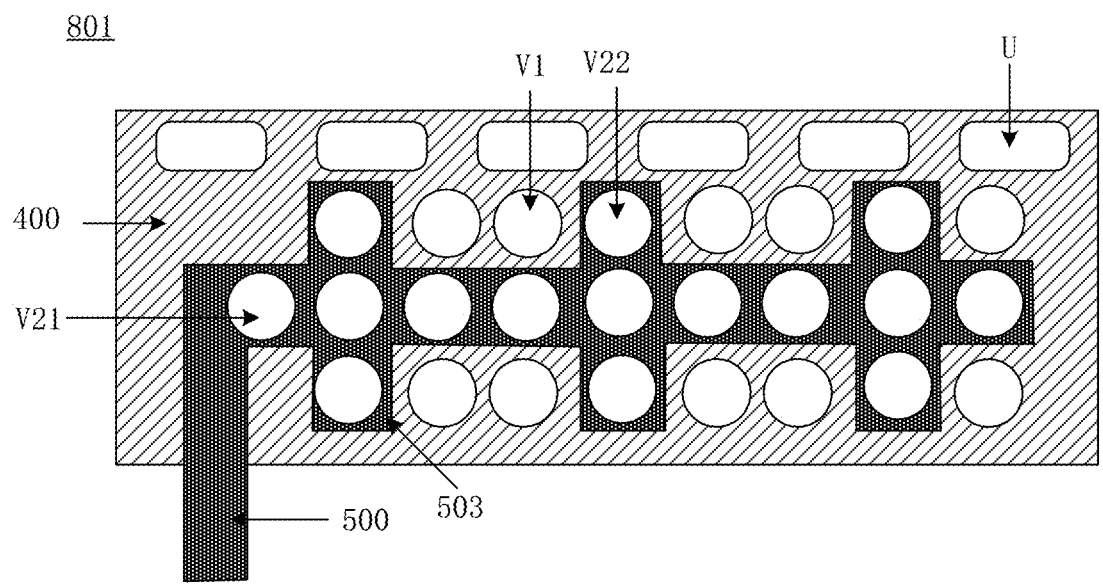
FIG. 14 a top view of a single GOA unit in still another array substrate according to some embodiments of the present disclosure.

FIG. 14 a top view of a single GOA unit in still another array substrate according to some embodiments of the present disclosure. Optionally, referring to FIG. 14, the plurality of second vias V2 further include a plurality of second lap vias V22. One of the second lap vias V22 is disposed between adjacent two first vias V1 in a row of first vias V1.

The second electrode 500 includes: a strip-shaped second electrode body 501 and a plurality of electrode blocks 503 in one-to-one correspondence with the plurality of second lap vias V22. The second electrode body 501 is electrically connected to the electrode block 503. An orthographic projection of the second electrode body 501 on the substrate 100 is within an orthographic projection of at least one row of first lap vias V21 on the substrate 100. An orthographic projection of the electrode block 503 on the substrate 100 is within an orthographic projection of the corresponding second lap via V22 on the substrate 100.

In this case, the second vias V2 include the plurality of first lap vias V21 on the strip-shaped second electrode body 501 and the plurality of second lap vias V22 in one-to-one correspondence with the plurality of electrode blocks 503, such that the number of second vias V2 is increased, and thus the area of the region, where the climbing height is small, in the lap electrode 600 is further increase.

In some embodiments, referring to FIG. 14, a portion of the plurality of second lap vias V22 and a row in adjacent two rows of first vias V1 are arranged in a row, and another portion of the plurality of second vias V22 and another row in the adjacent two rows of first vias V1 are arranged in a row. In this way, the effectiveness of the electrical connection between the first electrode 400 to the second electrode 500 is improved.

In some embodiments, referring to FIG. 14, the first electrode 400 also includes a plurality of hollowed-out structures U. Because the first electrode 400 is generally made of a metallic conductor material, the area of the orthographic projection of the first electrode 400 on the substrate 100 is reduced in the case that a plurality of hollowed-out structures U are arranged in the first electrode 400. In this way, the probability of the undesirable defect of electrostatic breakdown due to the accumulation of electric charges at the first electrode 400 during the manufacturing process of the array substrate 000 is reduced, and thus the display effect of the display device with the array substrate integrated is improved.

In summary, some embodiments of the present disclosure provide an array substrate, including: the substrate, the first insulating layer, the second insulating layer, the first electrode, the second electrode, and the lap electrode. In the case that the orthographic projection of the first electrode on the substrate covers the region between at least one of the first vias and at least one of the second vias, the first electrode, the first insulating layer, and the second insulating layer are stacked in the region between the first via and the second via, and the first electrode, the first insulating layer, the second electrode, and the second insulating layer are stacked in the region around the second via at the same time. In this way, the height difference between the portion, between the first via and the second via, of the lap electrode and the portion, around the second via, of the lap electrode is small, and this height difference is the thickness of the second electrode. Therefore, during the process that the lap electrode is lapped to the second electrode, the climbing height of the lap electrode is small, which effectively reduces the probability of open circuit occurring to the lap electrode. In this way, the electrical connection effect between the first electrode and the second electrode is better, such that the electrical connection effect between the GOA circuit and the plurality of gate lines in the array substrate is better, and thus the display effect of the display device with the array substrate integrated is effectively improved.

Figure 15:
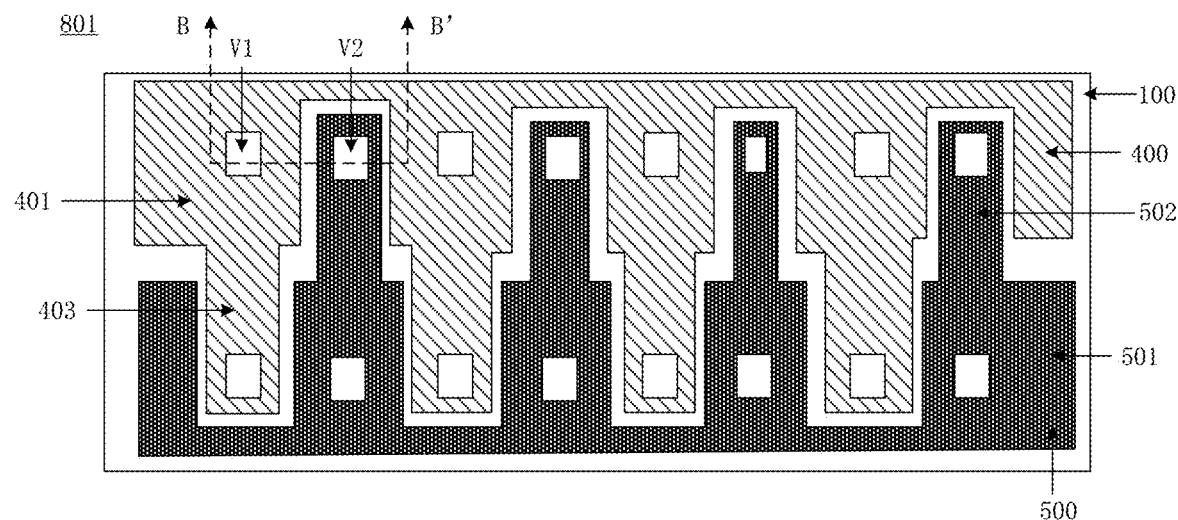
FIG. 15 is a top view of a single GOA unit in still another array substrate according to some embodiments of the present disclosure.
Figure 16:
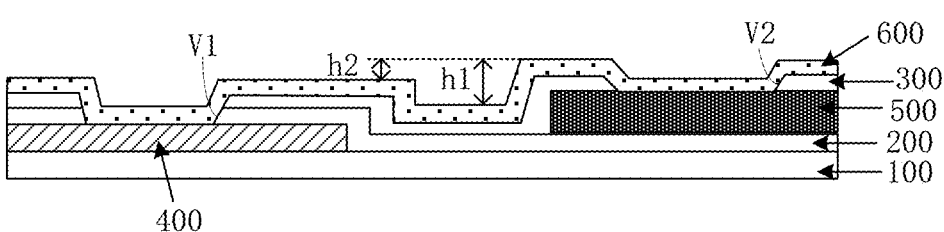
FIG. 16 is a sectional diagram of the array substrate illustrated in FIG. 15 at a B-B' position.

FIG. 15 is a top view of a single GOA unit in still another array substrate according to some embodiments of the present disclosure, and FIG. 16 is a sectional diagram of the array substrate illustrated in FIG. 15 at a B-B' position. Referring to FIG. 15 and FIG. 16, the array substrate 000 includes: a substrate 100, a first insulating layer 200, a second insulating layer 300, a first electrode 400, a second electrode 500, and a lap electrode 600.

The first insulating layer 200 and the second insulating layer 300 in the array substrate 000 are successively stacked along a direction perpendicular to and away from the substrate 100. The first electrode 400 in the array substrate 000 is disposed on a side, proximal to the substrate 100, of the first insulating layer 200. The second electrode 500 is disposed between the first insulating layer 200 and the second insulating layer 300. The lap electrode 600 is disposed on a side, distal from the substrate 100, of the second insulating layer 300.

The array substrate 000 includes a plurality of first vias V1 and a plurality of second vias V2. The lap electrode 600 is lapped to the first electrode 400 through the plurality of first vias V1, and is further lapped to the second electrode 500 through the plurality of second vias V2. In this way, the second electrode 500 is lapped to the first electrode 400 by the lap electrode 600.

In the present disclosure, an orthographic projection of the first electrode 400 on the substrate 100 is not overlapped with an orthographic projection of the second electrode 500 on the substrate 100.

In some embodiments, the first electrode 400 and the second electrode 500 herein both belong to a GOA unit 801 in a GOA circuit 800. The first electrode 400 in the GOA unit 801 is electrically connected to a gate line in the array substrate 000, and the second electrode 400 in the GOA unit 801 is electrically connected to a signal output terminal in the GOA circuit 800.

In some embodiments of the present disclosure, in the case that the orthographic projection of the first electrode 400 on the substrate 100 is not overlapped with the orthographic projection of the second electrode 500 on the substrate 100, the first insulating layer 200 and the second insulating layer 300 are stacked in a region between the first via V1 and the second via V2, and the first insulating layer 200, the second electrode 500, and the second insulating layer 300 are stacked in a region around the second via V2 at the same time. In this way, a height difference h1 between a portion, between the first via V1 and the second via V2, of the lap electrode 600 and a portion, around the second via V2, of the lap electrode 600 is small, and this height difference h1 is a thickness of the second electrode 500. Therefore, during the process that the lap electrode 600 is lapped to the second electrode 500, a climbing height of the lap electrode 600 is small, which effectively reduces the probability of open circuit occurring to the lap electrode 600, such that an electrical connection effect between the first electrode 400 and the second electrode 500 is better. Moreover, the first insulating layer 200 and the first electrode 400 are stacked in a region around the first via V1, such that a height difference h2 between a portion, around the first via V1, of the lap electrode 600 and the portion, around the second vias V2, of the lap electrode 600 is small, and thus the flatness of the array substrate 000 is improved. In this way, during a process of assembling a display device with the array substrate 000 integrated, compactness of the array substrate 000 and a color film substrate in the display device is improved, and thus the probability of water vapor entering the display device is reduced.

In some embodiments, as illustrated in FIG. 15, the first electrode 400 includes: a plurality of first connection arms 403 and a first electrode body 401 configured to connect the plurality of first connection arms 403. Orthographic projections of the plurality of first vias V1 on the substrate 100 are within orthographic projections of the plurality of first connection arms 403 on the substrate.

The second electrode 500 includes a plurality of second connection arms 502 and a second electrode body 501 configured to connect the plurality of second connection arms 502. Orthographic projections of the plurality of second vias V2 on the substrate 100 are within orthographic projections of the plurality of second connection arms 502 on the substrate 100. The plurality of first connection arms 403 and the plurality of second connection arms 502 are alternately arranged one by one.

In this case, the first electrode 400 is lapped to the second electrode 500 by the lap electrode 600 through the first via V1 on the first connection arm 403 and the second via V2 on the second connection arm 502. The plurality of first connection arms 403 and the plurality of second connection arms 502 are alternately arranged one by one, such that the uniformity of lapping in each region is improve, and thus the effectiveness of the electrical connection between the first electrode 400 and the second electrode 500 is improved.

Figure 17:
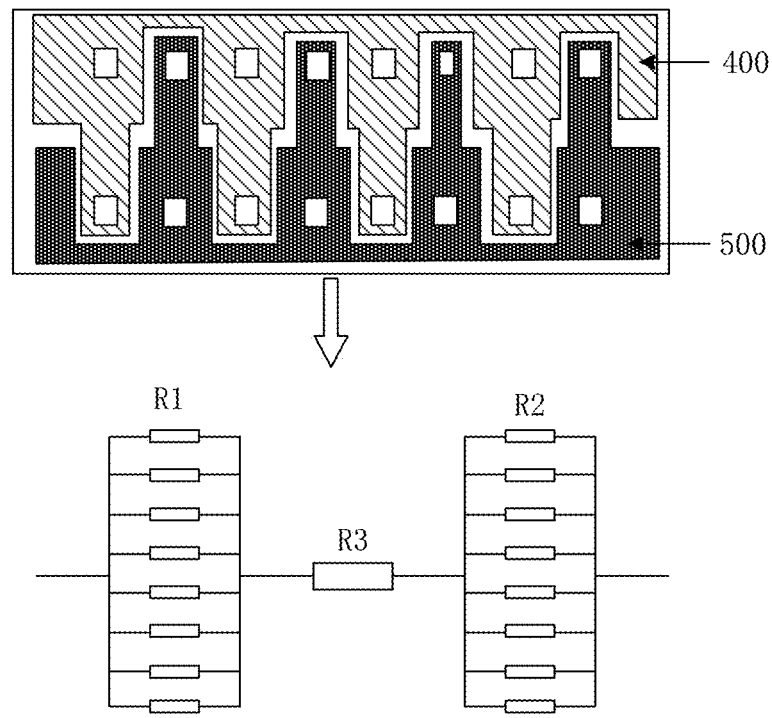
FIG. 17 is a schematic diagram of an equivalent circuit of a lap resistance of a lap electrodes 600 in the GOA unit illustrated in FIG. 15.

FIG. 17 is a schematic diagram of an equivalent circuit of a lap resistance of a lap electrodes 600 in the GOA unit illustrated in FIG. 15. It should be noted that, referring to FIG. 17, for a method for calculating a lap resistance of the first via V1 and the second via V2 in the lap electrode 600, reference is made to the method for calculating the lap resistance of the first via V1 and the first lap via V21 in the lap electrode 600 as described above, which is not repeated herein.

As illustrated in FIG. 16, in the case that a plurality of first vias V1 and a plurality of second vias V2 are provided, resistances R1 of portions, within the first vias V1, of the lap electrodes 600 are connected in parallel, and resistance R2 of portions, within the second vias V2, of the lap electrodes 600 are connected in parallel. In this way, the greater the number of first vias V1 and second vias V2, the smaller the total resistance of R1 connected in parallel, and the smaller the total resistance of R2 connected in parallel.

In some embodiments, the number of first via holes V1 is eight and the number of second via holes V2 is eight. The lap resistance of the lap electrode 600 includes: the total resistance of the eight R1 connected in parallel, the total resistance of the eight R2 connected in parallel, and a resistance R3 of a portion, between the first via hole V1 and the second via hole V2, of the lap electrode 600. That is, the lap resistance of the lap electrode 600 is:

$$R = \frac{1}{8}(R1 + R2) + R3$$

In the case that the plurality of first connection arms 403 and the plurality of second connection arms 502 are alternately arranged one by one, the lap resistance of the lap electrode 600 is reduced by increasing the number of first vias V1 and the number of second vias V2. Moreover, the height difference h1 between the portion, between the first via V1 and the second via V2, of the lap electrode 600 and the portion, around the second via V2, of the lap electrode 600 is small, such that the resistance of the portion, between the first via V1 and the second via V2, of the lap electrode 600, is small, and thus the lap resistance of the lap electrode 600 is further reduced.

Figure 18:
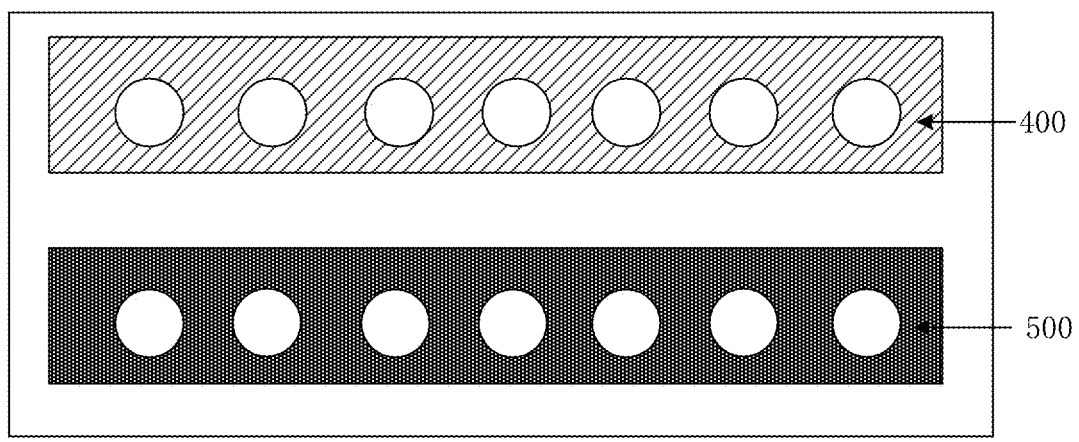
FIG. 18 is a top view of a single GOA unit in still another array substrate according to some embodiments of the present disclosure.

FIG. 18 is a top view of a single GOA unit in still another array substrate according to some embodiments of the present disclosure. In some embodiments, as illustrated in FIG. 18, both the first electrode 400 and the second electrode 500 are strip-shaped. An extension direction of the first electrode 400 is parallel to an extension direction of the second electrode 500, and a gap is present between the orthographic projection of the first electrode 400 on the substrate and the orthographic projection of the second electrode 500 on the substrate.

In the case that the gap is present between the orthographic projection of the first electrode 400 on the substrate and the orthographic projection of the second electrode 500 on the substrate, areas of the orthographic projections of the first electrode 400 and the second electrode 500 on the substrate 100 are reduced and the flatness of the array substrate 000 is improved, such that the probability of the undesirable defect of electrostatic breakdown due to the accumulation of electric charges at the first electrode 400 and the second electrode 500 during the manufacturing process of the array substrate 000 is reduced.

In summary, some embodiments of the present disclosure provide an array substrate, including: the substrate, the first insulating layer, the second insulating layer, the first electrode, the second electrode, and the lap electrode. In the case that the orthographic projection of the first electrode on the substrate is not overlapped with the orthographic projection of the second electrode on the substrate, the first insulating layer and the second insulating layer are stacked in the region between the first via and the second via, and the first insulating layer, the second electrode, and the second insulating layer are stacked in the region around the second via at the same time. In this way, the height difference between the portion, between the first via and the second via, of the lap electrode and the portion, around the second via, of the lap electrode is small, and this height difference is the thickness of the second electrode. Therefore, during the process that the lap electrode is lapped to the second electrode, the climbing height of the lap electrode is small, which effectively reduces the probability of open circuit occurring to the lap electrode, such that the electrical connection effect between the first electrode and the second electrode is better. Moreover, the first insulating layer and the first electrode are stacked in the region around the first via, such that the height difference between the portion, around the first via, of the lap electrode and the portion, around the second via, of the lap electrode is small, and thus the flatness of the array substrate is improved. In this wat, during assembling a display device where the array substrate is integrated, the compactness of the array substrate and a color film substrate in the display device is improved, and thus the probability of water vapor entering the display device is reduced.

Some embodiments of the present disclosure further provide a display device. The display device includes: an array substrate 000 and a color film substrate that are arranged opposite to each other, and a liquid crystal layer disposed between the array substrate 000 and the color film substrate. The array substrate 000 is the array substrate 000 described above. The display device is: a display, a smartphone, a tablet computer, a television, a laptop computer, a digital photo frame, a navigator, or any other product or component with a display function.

It should be noted that in the accompanying drawings, sizes of layers and regions may be exaggerated for clearer illustration. It should be understood that where an element or layer is referred to as being "on" another element or layer, the element or layer may be directly on another element, or intervening layers therebetween may be present. In addition, it should be understood that where an element or layer is referred to as being "under" another element or layer, the element or layer may be directly under the other element, or there may be more than one intervening layer or element. In addition, it may be further understood that in the case that a layer or element is referred to as being "between" two layers or two elements, the layer may be the only layer between the two layers or two elements, or more than one intervening layer or element may further be present. Like reference numerals indicate like elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. An array substrate, comprising:
a substrate;
a first insulating layer and a second insulating layer that are successively stacked along a direction perpendicular to and away from the substrate;
a first electrode disposed on a side, proximal to the substrate, of the first insulating layer;
a second electrode disposed between the first insulating layer and the second insulating layer; and
a lap electrode disposed on a side, distal from the substrate, of the second insulating layer; wherein
the array substrate comprises a plurality of first vias and a plurality of second vias, and the lap electrode is electrically connected to the first electrode through the plurality of first vias and is electrically connected to the second electrode through the plurality of second vias; and
an orthographic projection of the first electrode on the substrate is at least partially overlapped with an orthographic projection of the second electrode on the substrate, and the orthographic projection of the first electrode on the substrate covers a region between at least one of the first vias and at least one of the second vias,
wherein the first electrode comprises a first electrode strip and a second electrode strip that are arranged in parallel, and at least one first connection arm disposed between the first electrode strip and the second electrode strip; and
orthographic projections of the plurality of first vias on the substrate are within an orthographic projection of the first electrode strip on the substrate, and orthographic projections of at least a portion of the plurality of second vias on the substrate are within an orthographic projection of the second electrode strip on the substrate and are within the orthographic projection of the second electrode on the substrate.

2. The array substrate according to claim 1, wherein an orthographic projection of the first connection arm on the substrate covers an entire region between a first target via and a second target via;
wherein the first target via is any of the plurality of first vias, and the second target via is one of the plurality of second vias, of which an orthographic projection is overlapped with the second electrode strip and which is adjacent to the first target via.

3. The array substrate according to claim 1, wherein the plurality of second vias comprise at least one first lap via and a plurality of second lap vias, and the second electrode comprises a second electrode body and at least one second connection arm corresponding to the at least one first lap via one by one, wherein the second connection arm is electrically connected to the second electrode body; wherein
an orthographic projection of the at least one first lap via on the substrate is within the orthographic projection of the first electrode strip on the substrate and is within an orthographic projection of a corresponding second connection arm on the substrate; and
orthographic projections of the plurality of second lap vias on the substrate are within the orthographic projection of the second electrode strip on the substrate and are within an orthographic projection of the second electrode body on the substrate.

4. The array substrate according to claim 3, wherein
the plurality of first vias are arranged in at least one row, and one of the first lap vias is disposed between adjacent two first vias in a row of the first vias; and
the plurality of second lap vias are arranged in at least one row.

5. The array substrate according to claim 3, wherein in a case a plurality of the first connection arms and a plurality of the second connection arms are provided, the plurality of the first connection arms and the plurality of the second connection arms are alternately arranged one by one, and a gap is present between one of the first connection arms and one of the second connection arm that are adjacent.

6. The array substrate according to claim 3, wherein a boundary of an orthographic projection of the first connection arm on the substrate is overlapped with a boundary of an orthographic projection of the second connection arm on the substrate.

7. A display device, comprising: an array substrate and a color film substrate that are disposed opposite to each other, and a liquid crystal layer disposed between the array substrate and the color film substrate;
wherein the array substrate comprises:
a substrate;
a first insulating layer and a second insulating layer that are successively stacked along a direction perpendicular to and away from the substrate;
a first electrode disposed on a side, proximal to the substrate, of the first insulating layer;
a second electrode disposed between the first insulating layer and the second insulating layer; and
a lap electrode disposed on a side, distal from the substrate, of the second insulating layer; wherein
the array substrate comprises a plurality of first vias and a plurality of second vias, and the lap electrode is electrically connected to the first electrode through the plurality of first vias and is electrically connected to the second electrode through the plurality of second vias; and
an orthographic projection of the first electrode on the substrate is at least partially overlapped with an orthographic projection of the second electrode on the substrate, and the orthographic projection of the first electrode on the substrate covers a region between at least one of the first vias and at least one of the second vias,
wherein the first electrode comprises a first electrode strip and a second electrode strip that are arranged in parallel, and at least one first connection arm disposed between the first electrode strip and the second electrode strip; and
orthographic projections of the plurality of first vias on the substrate are within an orthographic projection of the first electrode strip on the substrate, and orthographic projections of at least a portion of the plurality of second vias on the substrate are within an orthographic projection of the second electrode strip on the substrate and are within the orthographic projection of the second electrode on the substrate.

* * * * *